(12) United States Patent
Ebihara et al.

(10) Patent No.: US 11,722,801 B1
(45) Date of Patent: Aug. 8, 2023

(54) RAMP SETTLING ASSIST CIRCUIT IN LOCAL RAMP BUFFER CIRCUIT

(71) Applicant: OMNIVISION TECHNOLOGIES, INC., Santa Clara, CA (US)

(72) Inventors: Hiroaki Ebihara, San Jose, CA (US); Zhenfu Tian, San Jose, CA (US); Tao Sun, San Jose, CA (US); Liang Zuo, Milpitas, CA (US); Yu-Shen Yang, San Jose, CA (US); Satoshi Sakurai, Cupertino, CA (US); Rui Wang, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 17/659,042

(22) Filed: Apr. 13, 2022

(51) Int. Cl.
*H04N 25/75* (2023.01)
*H04N 25/772* (2023.01)

(52) U.S. Cl.
CPC .......... *H04N 25/75* (2023.01); *H04N 25/772* (2023.01)

(58) Field of Classification Search
None
See application file for complete search history.

(56) References Cited

U.S. PATENT DOCUMENTS

| 10,498,993 | B1 | 12/2019 | Ebihara et al. |
| 10,826,470 | B2 | 11/2020 | Zuo et al. |
| 2022/0060647 | A1* | 2/2022 | Lee ............... H04N 25/616 |

OTHER PUBLICATIONS

U.S. Appl. No. 17/217,950, filed Mar. 30, 2021 (37 pages).

* cited by examiner

*Primary Examiner* — Mark T Monk
(74) *Attorney, Agent, or Firm* — Perkins Coie LLP

(57) ABSTRACT

A ramp buffer circuit includes an input device having an input coupled to receive a ramp signal. A bias current source is coupled to an output of the input device. The input device and the bias current source are coupled between a power line and ground. An assist current source is coupled between the output of the input device and ground. The assist current source is configured to conduct an assist current from the output of the input device to ground only during a ramp event generated in the ramp signal.

14 Claims, 5 Drawing Sheets

RAMP SETTLING ASSIST CIRCUIT IN LOCAL RAMP BUFFER CIRCUIT

BACKGROUND INFORMATION

Field of the Disclosure

This disclosure relates generally to image sensors, and in particular but not exclusively, relates to a ramp generator in an image sensor.

Background

Image sensors have become ubiquitous and are now widely used in digital cameras, cellular phones, security cameras as well as in medical, automotive, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing. The technology used to manufacture image sensors has continued to advance at a great pace. For example, the demands of higher resolution and lower power consumption have encouraged the further miniaturization and integration of these devices.

A typical complementary metal oxide semiconductor (CMOS) image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which are read out as analog signals from the column bitlines and converted to digital values to produce digital images (i.e., image data) that represent the external scene.

Analog to digital converters (ADCs) are often used in CMOS image sensors (CIS) to convert the charge into a digital representation of the charge by the image sensor. The ADCs generate the digital representations of the charge based on a comparison of an image charge signal to a reference voltage signal. The reference voltage signal may conventionally be a ramp signal provided by a ramp generator and the comparison may conventionally be performed by a comparator, which provides an output that can be used with a counter to generate the digital representation of the image charge.

It is appreciated that the ramp settling time, or delay, of the ramp signal that is generated by the ramp generator and received by the comparator can limit the maximum frame rate of the image sensor. Thus, reducing the ramp settling time of the ramp signal that is received by the comparator can increase the maximum frame rate and therefore the performance of the image sensor.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
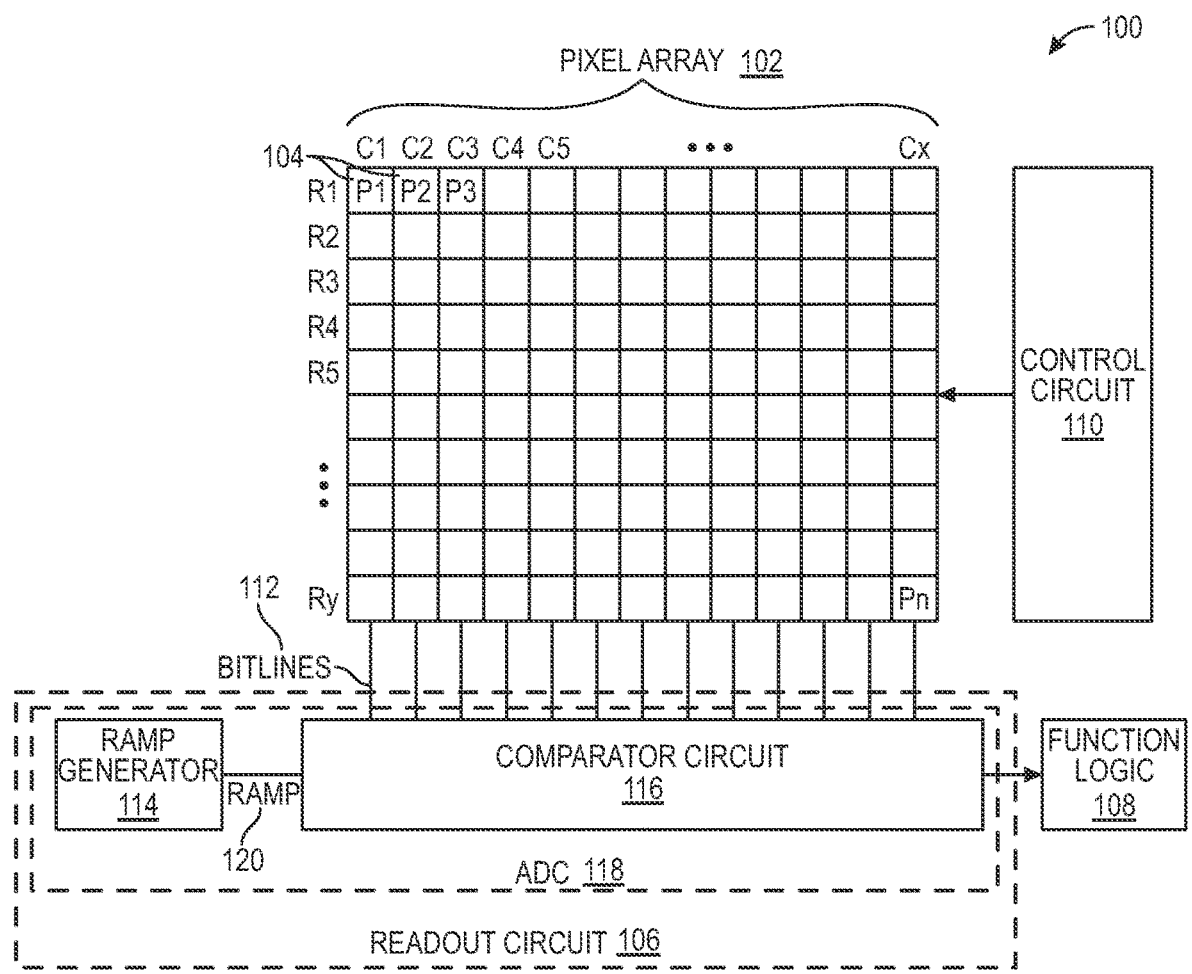
FIG. 1 illustrates one example of an imaging system including a readout circuit including a low power ramp settling assist circuit included in a local ramp buffer circuit in an analog to digital converter in the readout circuit in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Examples directed to an imaging system including a readout circuit having ramp settling assist circuits included in local ramp buffer circuits are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system including a readout circuit with low power ramp settling assist circuits included in local ramp buffer circuits are described. In various examples, a ramp generator is configured to generate a system level ramp signal that is coupled to be received by the analog to digital converters included in the readout circuit. Each analog to digital converter includes a comparator that is coupled to receive analog image data from a column bitline from a pixel array and the ramp signal through a local ramp buffer circuit. In the examples, a low power ramp settling assist circuit includes an assist current source that is included in each local ramp buffer and is coupled between the output of the local ramp buffer circuit and ground. In the examples, the low power ramp settling assist circuit provides an assist current from the output of the local ramp buffer circuit to ground that is switched on during a ramp event or a ramp phase of the output local ramp buffer circuit. For purposes of this disclosure, it is appreciated that a ramp event of the output ramp signal is the time during which the ramp signal decreases continuously. In another example, it is appreciated that the ramp event of the output ramp signal could also be considered as the time during which the ramp signal increases continuously. An output capacitor coupled to the output of the local ramp buffer circuit is charged by the assist current, which therefore reduces a ramp settling time delay of the ramp signal that is caused by loading of the output of the local ramp buffer circuit, which therefore improves the maximum frame rate and image sensor performance in accordance with the teachings of the present invention. In addition, in various examples, changes in the power line currents are also reduced as the low power ramp settling assist circuit is activated during ramp events and deactivated prior to the ramp events. Since the low power ramp settling assist circuit is coupled between ground and the output of the local ramp buffer circuit and the charging current of the output capacitor is supplied from the low power ramp settling assist circuit, the capacitance between the output of the local ramp buffer circuit and ground does not contribute to changes in power line currents during ramp events in accordance with the teachings of the present invention.

To illustrate, FIG. 1 shows one example of an imaging system 100 including a readout circuit including low power ramp settling assist circuits included in local ramp buffer circuits 'in accordance with the teachings of the present invention. As shown in the illustrated example, imaging system 100 includes a pixel array 102, a control circuit 110, a readout circuit 106, and function logic 108. In one example, pixel array 102 is a two-dimensional (2D) array including a plurality of pixel circuits 104 (e.g., P1, P2, . . . , Pn) that are arranged into rows (e.g., R1 to Ry) and columns (e.g., C1 to Cx) to acquire image data of a person, place, object, etc., which can then be used to render an image of a person, place, object, etc.

In various examples, each pixel circuit 104 may include one or more photodiodes configured to photogenerate image charge in response to incident light. The image charge generated in each photodiode is transferred to a floating diffusion included in each pixel circuit 104, which is converted to an image signal and then read out from each pixel circuit 104 by readout circuit 106 through column bitlines 112. In the various examples, readout circuit 106 may read out a row of image data at a time along readout column bitlines 112 (illustrated) or may read out the image data using a variety of other techniques (not illustrated), such as a serial readout or a full parallel readout of all pixel circuits 104 simultaneously.

In various examples, readout circuit 106 may include amplification circuitry, an analog to digital converter (ADC), or otherwise. In the depicted example, ADC 118 includes a comparator circuit 116 coupled to receive the image signals from pixel array 102 through the column bitlines 112. In one example, the comparator circuit 116 may include a plurality of comparators coupled to receive the image signals through the bitlines 112. In the example, each of the comparators included in comparator circuit 116 is also coupled to receive a ramp signal 140 from a ramp generator 114 as shown. In the various examples, each of the comparators is coupled to receive the ramp signal 140 through a local ramp buffer circuit. Each comparator included in comparator circuit 116 may be used to determine a digital representation of the image signal using a counter based on a comparison of ramp signal 140 to the image signal voltage level received through bitlines 112. As will be discussed, in the various examples, each local ramp buffer circuit includes a low power ramp settling assist circuit, which reduces the ramp settling time, or delay, of the ramp signal 140 to increase the maximum frame rate and therefore improve the performance of the imaging system 100 in accordance with the teachings of the present invention.

In the example, the digital image data values generated by ADC 118 may then be received by function logic 108. Function logic 108 may simply store the digital image data or even manipulate the digital image data by applying post image effects (e.g., crop, rotate, remove red eye, adjust brightness, adjust contrast, or otherwise).

In one example, control circuit 104 is coupled to pixel array 102 to control operation of the plurality of photodiodes in pixel array 102. For example, control circuit 104 may generate a shutter signal for controlling image acquisition. In one example, the shutter signal is a global shutter signal for simultaneously enabling all pixel circuits 104 within pixel array 102 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 100 may be included in a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
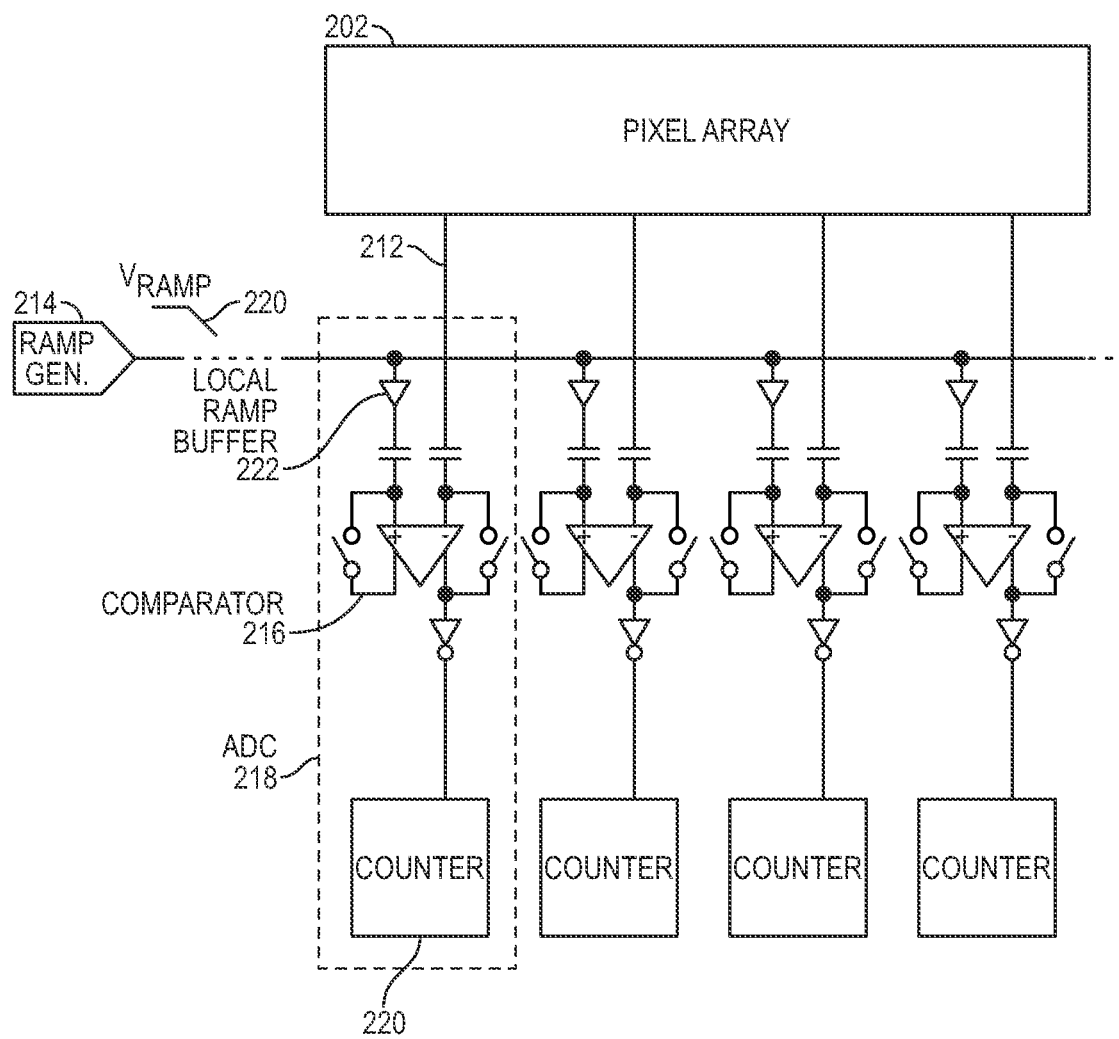
FIG. 2 is a block diagram illustrating example analog to digital converters coupled to receive a ramp signal from a ramp generator through local ramp buffers in accordance with the teachings of the present invention.

FIG. 2 is a block diagram illustrating example analog to digital converters coupled to receive a ramp signal from a ramp generator through local ramp buffers in accordance with the teachings of the present invention. It is appreciated that the analog to digital converters shown in FIG. 2 may be examples of analog to digital converters included in the readout circuit illustrated in FIG. 1, and that similarly named and numbered elements described above are coupled and function similarly below.

To illustrate, FIG. 2 shows a plurality of analog to digital converters (ADCs) 218 coupled to receive analog image data from pixel array 202 through respective bitlines 212. It is appreciated that each of the ADCs 218 illustrated in FIG. 2 are substantially similar to one another, and that only one of the ADCs 218 is labeled in FIG. 2 for the sake of brevity. As shown in the depicted example, a ramp generator 214 is configured to generate a system level ramp signal $V_{RAMP}$ 220. Each ADC 218 includes a comparator 216 having a first input (e.g., inverting input) coupled to receive the analog image data from pixel array 202 through bitline 212, and a second input coupled to receive the ramp signal $V_{RAMP}$ 220 through a local ramp buffer circuit 222. In operation, each comparator is configured to flip when the voltage of the ramp signal $V_{RAMP}$ 220 received by the comparator 216 through local ramp buffer circuit 222 reaches or is equal to the voltage of the analog image data received from the bitline 212. A counter 220 is coupled to the output of comparator 216 to provide a digital representation of the voltage of the analog image data received from the bitline 212 when the comparator 216 flips in response to a comparison of the ramp signal $V_{RAMP}$ 220 received through local ramp buffer circuit 222 and the voltage of the analog image data received from the bitline 212

Figure 3A:
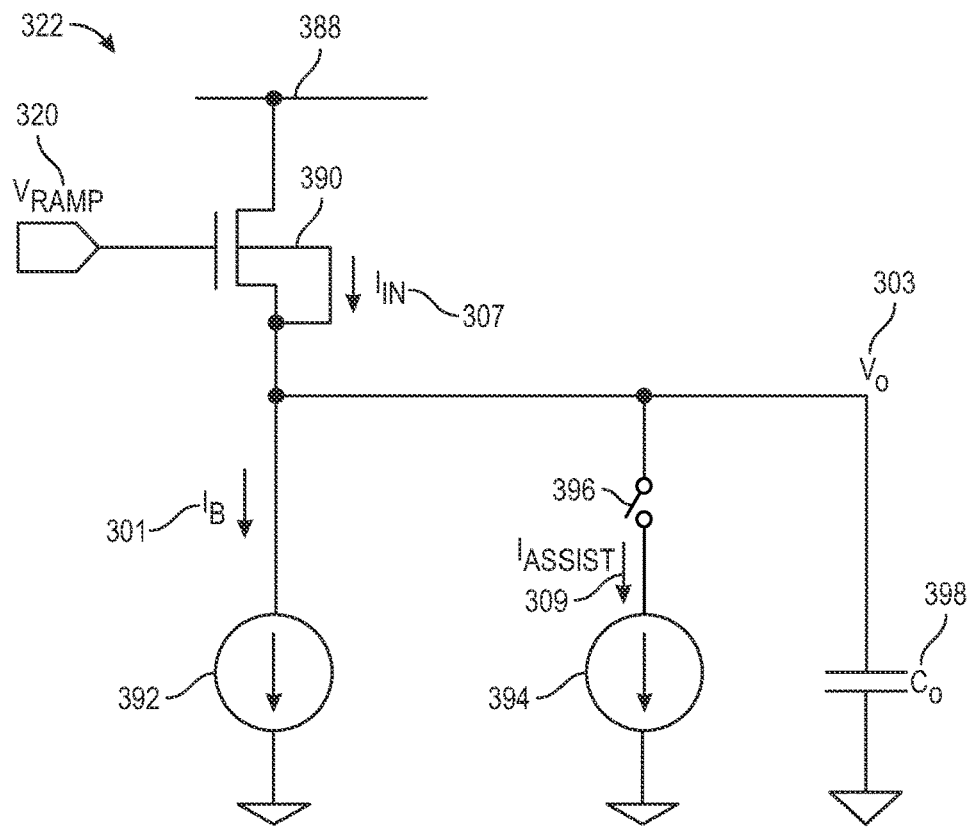
FIG. 3A shows one example of a schematic of a local ramp buffer circuit including a ramp settling assist circuit before a ramp event in accordance with the teachings of the present invention.

FIG. 3A shows one example of a schematic of a local ramp buffer circuit including a ramp settling assist circuit before a ramp event in accordance with the teachings of the present invention. It is appreciated that the local ramp buffer circuit illustrated in FIG. 3A may be an example local ramp buffer circuit illustrated in FIG. 2, and that similarly named and numbered elements described above are coupled and function similarly below.

As shown in the example depicted in FIG. 3A, a ramp buffer circuit 322 includes an input device 390 having an input coupled to receive a ramp signal $V_{RAMP}$ 320. In the depicted example, input device 390 is illustrated as an NMOS transistor having a drain coupled to a power line 388 (e.g., $V_{DD}$), a gate coupled to receive the ramp signal $V_{RAMP}$ 320, and a source that is configured to be the output of the input device 390. A bias current source 392 is coupled to the output of the input device 390 such that the input device 390 and the bias current source 392 are coupled between the power line 388 and ground. In operation, an input current $I_{IN}$ 307 is the drain source current of input device 390 that is configured to be conducted through input device 390 and a bias current $I_B$ 301 is configured to be conducted through bias current source 392.

In the depicted example, an output capacitor $C_O$ 398 or loading capacitor is coupled between the output of the input device 390 and ground. An assist current source 394 is also coupled between the output of the input device 390 and ground. In the various examples, the assist current source 394 is configured to conduct an assist current $I_{ASSIST}$ 309 from the output of the input device 390 to ground only during a ramp event generated in the ramp signal $V_{RAMP}$ 320. In the illustrated example, an assist current switch 396 is coupled to the assist current source 394 such that the assist current switch 396 and the assist current source 394 are coupled between the output of the input device 390 and ground. In various examples, the assist current switch 396 is configured to be turned on only during a ramp event generated in the ramp signal $V_{RAMP}$ 320 such that the assist current source 394 is configured to be activated to conduct the assist current $I_{ASSIST}$ 309 from the output of the input device 390 to ground only during the ramp event generated in the ramp signal $V_{RAMP}$ 320. In various examples, the assist current $I_{ASSIST}$ 309 conducted by the assist current source 394 during the ramp event generated in the ramp signal $V_{RAMP}$ 320 is substantially equal to a charging current of the output capacitor $C_O$ 398 coupled to the output of the input device 390 during the ramp event generated in the ramp signal $V_{RAMP}$ 320.

The example depicted in FIG. 3A illustrates an example during which a ramp event is not occurring in the ramp signal $V_{RAMP}$ 320 (e.g., prior to a ramp event or during a non-ramp event of ramp signal $V_{RAMP}$ 320). As such, the assist current switch 396 is turned off and the assist current source 394 is deactivated such that assist current $I_{ASSIST}$ 309 is zero in the example depicted in FIG. 3A. At this time, it is also appreciated that the output capacitor $C_O$ 398 is not being charged or discharged and that the input current $I_{IN}$ 307 is substantially equal to the bias current $I_B$ 301.

Figure 3B:
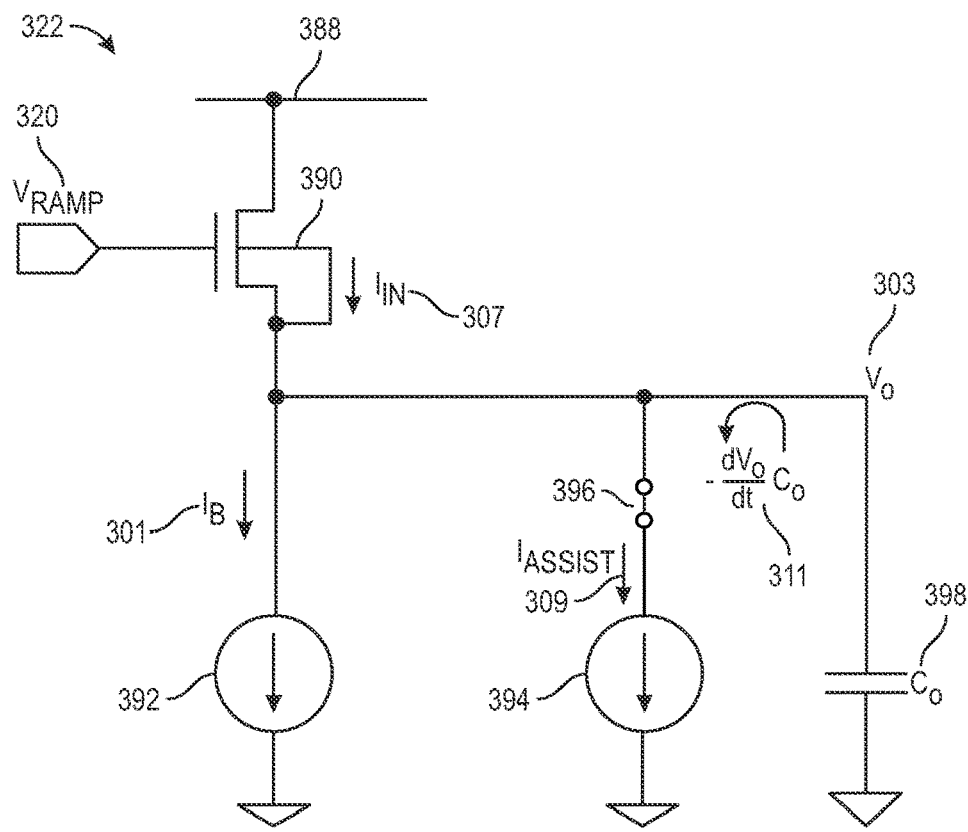
FIG. 3B shows one example of a schematic of a local ramp buffer circuit including a ramp settling assist circuit during a ramp event in accordance with the teachings of the present invention.

FIG. 3B shows one example of a schematic of a local ramp buffer circuit including a ramp settling assist circuit during a ramp event in accordance with the teachings of the present invention. It is appreciated that the local ramp buffer circuit illustrated in FIG. 3B may be an example local ramp buffer circuit illustrated in FIG. 2, and that similarly named and numbered elements described above are coupled and function similarly below. It is further appreciated that the local ramp buffer circuit illustrated in FIG. 3B is the same as the local ramp buffer circuit illustrated in FIG. 3A with the exception that the assist current switch 396 is turned on in FIG. 3B because a ramp event is occurring in the ramp signal $V_{RAMP}$ 320 at this time. As such, the assist current source 394 is activated and the assist current $I_{ASSIST}$ 309 is conducted from the output of the input device 390 to ground through the assist current source 394. As mentioned, the assist current $I_{ASSIST}$ 309 is only drawn from the output of the input device 390 to ground during a ramp event in the ramp signal $V_{RAMP}$ 320.

In the depicted example, during a ramp event in the ramp signal $V_{RAMP}$ 320, the output voltage $V_O$ 303 at the output of the input device 390 and across the output capacitor $C_O$ 398 follows the ramp signal $V_{RAMP}$ 320 and therefore decreases continuously with respect to time. As such, the output capacitor $C_O$ 398 is charged with a charging current 311 according to the following equation:

$$\text{Charging current} = -\frac{dV_O}{dt}C_O \quad (1)$$

In the various examples, the assist current $I_{ASSIST}$ 309 provided by the assist current source 394 is substantially equal in magnitude to the charging current 311 of the output capacitor $C_O$ 398 during the ramp event. Thus, the assist current $I_{ASSIST}$ 309 can also be determined according to the following equation:

$$I_{ASSIST} = -\frac{dV_O}{dt}C_O \quad (2)$$

As such, the bias current $I_B$ 301 of bias current source 392 does not need provide any of the charging current 311 for the output capacitor $C_O$ 398 during ramp events. Accordingly, the input current $I_{IN}$ 307 of the input device 390 remains substantially equal to the bias current $I_B$ 301 both during ramp events as well as prior to ramp events in accordance with the teachings of the present invention. In this way, the input current $I_{IN}$ 307 of the input device 390 remains constant and not changed before, during, and after the ramp events and does not depend on the signal slope of the ramp signal $V_{RAMP}$ 320 or the loading capacitance of the output capacitor 398 in accordance with the teachings of the present invention.

Figure 3C:
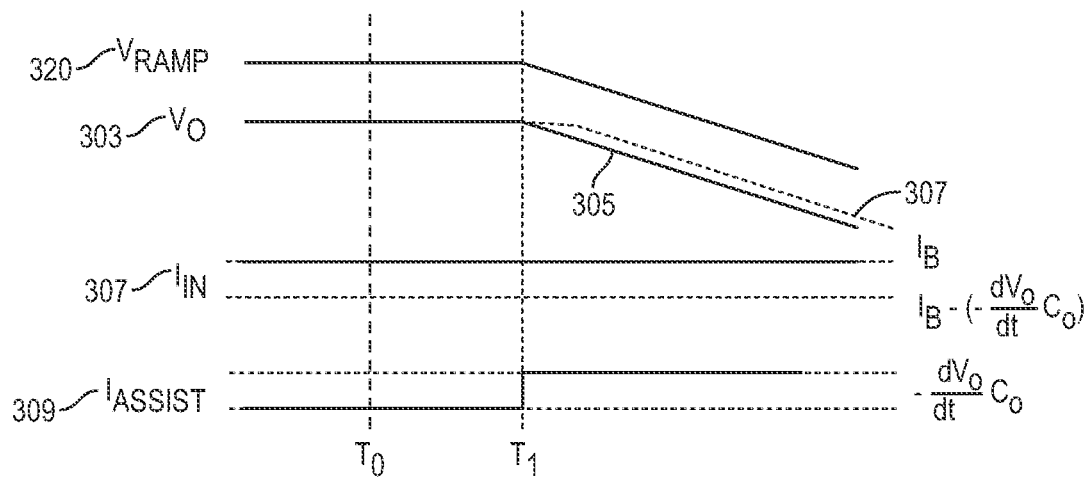
FIG. 3C is a timing diagram that illustrates signals in an example local ramp buffer circuit with a ramp settling assist circuit in accordance with the teachings of the present invention.

FIG. 3C is a timing diagram that illustrates signals in an example local ramp buffer circuit with a ramp settling assist circuit in accordance with the teachings of the present invention. It is appreciated that the signals illustrated in the timing diagram of FIG. 3C may be examples of signals found in the local ramp buffer circuit depicted in FIG. 3A and FIG. 3B, and that similarly named and numbered elements described above are coupled and function similarly below. In particular, the depicted example shows a ramp signal $V_{RAMP}$ 320, an output voltage signal $V_O$ 303, an input current $I_{IN}$ 307, and an assist current $I_{ASSIST}$ 309.

As shown in the example depicted in FIG. 3C, the ramp voltage signal $V_{RAMP}$ 320 and the output voltage $V_O$ 303 are both constant prior to the ramp event, which occurs at time T0. During this non-ramp event period of time before time T1, the input current $I_{IN}$ 307 is equal to the bias current $I_B$ and the assist current $I_{ASSIST}$ 309 is equal to zero as the assist current source 394 is deactivated.

At time T1, the ramp event occurs in the ramp signal $V_{RAMP}$ 320, which can be seen with the voltage of ramp signal $V_{RAMP}$ 320 ramping down and decreasing continuously after time T1. During this time, the assist current $I_{ASSIST}$ 309 transitions from zero to a value equal to the charging current of the output capacitor $C_O$ 398, which is $-(dV_O/dt)*C_O$ as shown. As a result, the charging current of the output capacitor $C_O$ 398 is provided by the assist current $I_{ASSIST}$ 309 and the input current $I_{IN}$ 307 remains the same during the ramp event and remains equal to the bias current $I_B$ in accordance with the teachings of the present invention. As such, it is appreciated that the output voltage $V_O$ 303 has an ideal ramp event 305 without any ramp settling time delay compared to the non-deal ramp event 307 with a ramp settling delay, which could be caused by the input current $I_{IN}$ 307 being reduced by $-(dV_O/dt)*C_O$ without an assist current $I_{ASSIST}$ 346 in accordance with the teachings of the present invention.

Figure 4A:
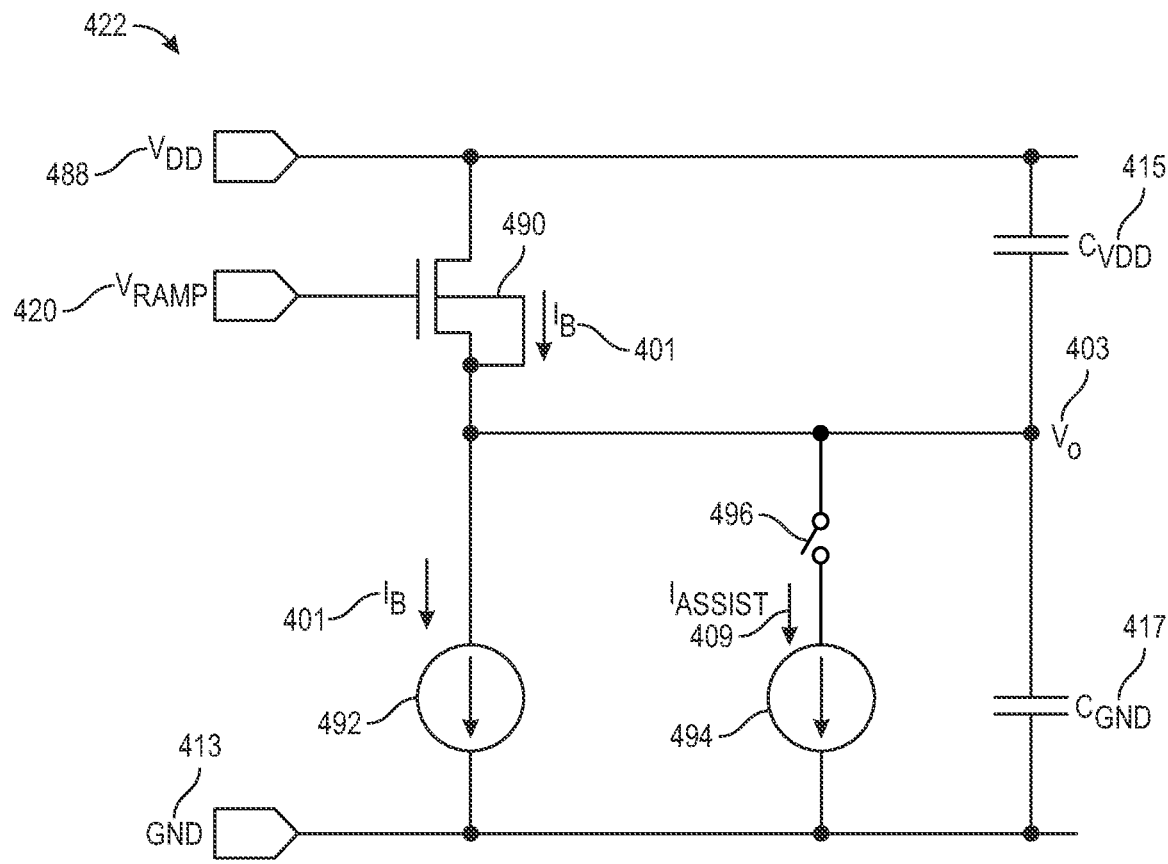
FIG. 4A shows one example of a schematic of a local ramp buffer circuit including a ramp settling assist circuit illustrating power consumption from a power line before a ramp event in accordance with the teachings of the present invention.

FIG. 4A shows one example of a schematic of a local ramp buffer circuit including a ramp settling assist circuit illustrating power consumption from a power line before a ramp event in accordance with the teachings of the present invention. It is appreciated that the local ramp buffer circuit illustrated in FIG. 4A may be an example local ramp buffer circuit illustrated in FIG. 2, and that similarly named and numbered elements described above are coupled and function similarly below. It is further appreciated that the local ramp buffer circuit illustrated in FIG. 4A shares many similarities with the local ramp buffer circuit illustrated in FIG. 3A.

For instance, as shown in the example depicted in FIG. 4A, ramp buffer circuit 422 includes an input device 490 having an input coupled to receive a ramp signal $V_{RAMP}$ 420. In the depicted example, input device 390 is illustrated as an NMOS transistor having a drain coupled to a power line 488 (e.g., $V_{DD}$), a gate coupled to receive the ramp signal $V_{RAMP}$ 320, and a source that is configured to be the output of the input device 490. A bias current source 492 is coupled to the output of the input device 490 such that the input device 490 and the bias current source 492 are coupled between the power line 488 and ground. In operation, the input current $I_{IN}$ of input device 490 is assumed to be equal to the bias current $I_B$ 401, which is configured to be conducted through both the input device 490 and the bias current source 492 as shown.

In the depicted example, an assist current source 494 is coupled between the output of the input device 490 and ground. In the various examples, the assist current source 494 is configured to conduct an assist current $I_{ASSIST}$ 494 from the output of the input device 490 to ground only during a ramp event generated in the ramp signal $V_{RAMP}$ 420. In the illustrated example, an assist current switch 496 is coupled to the assist current source 494 such that the assist current switch 496 and the assist current source 394 are coupled between the output of the input device 490 and ground. In various examples, the assist current switch 496 is configured to be turned on only during a ramp event generated in the ramp signal $V_{RAMP}$ 420 such that the assist current source 494 is configured to be activated to conduct the assist current $I_{ASSIST}$ 409 from the output of the input device 490 to ground only during the ramp event generated in the ramp signal $V_{RAMP}$ 420.

In various examples, the assist current $I_{ASSIST}$ 309 conducted by the assist current source 394 during the ramp event generated in the ramp signal $V_{RAMP}$ 320 is substantially equal to a charging current of the output capacitor $C_O$ 398 coupled to the output of the input device 390 during the ramp event generated in the ramp signal $V_{RAMP}$ 320.

One of the differences between the local ramp buffer circuit 422 shown in FIG. 4A and the local ramp buffer circuit 322 shown in FIG. 3A is that the output capacitor $C_O$ 398 shown in FIG. 3A is represented in the local ramp buffer circuit 422 shown in FIG. 4A with a power line capacitor $C_{VDD}$ 415 coupled between the power line 488 and the output of the input device 490 and a ground capacitor $C_{GND}$ 417 coupled between the output of the input device 490 and ground.

Similar to the example depicted in FIG. 3A, the example depicted in FIG. 4A illustrates an example during which a ramp event is not occurring in the ramp signal $V_{RAMP}$ 420 (e.g., prior to a ramp event or during a non-ramp event of ramp signal $V_{RAMP}$ 420). As such, the assist current switch 496 is turned off and the assist current source 494 is deactivated such that assist current $I_{ASSIST}$ 409 is zero in the example depicted in FIG. 4A. At this time, it is also appreciated that the power line capacitor $C_{VDD}$ 415 and the ground capacitor $C_{GND}$ 417 are not being charged or discharged.

Figure 4B:
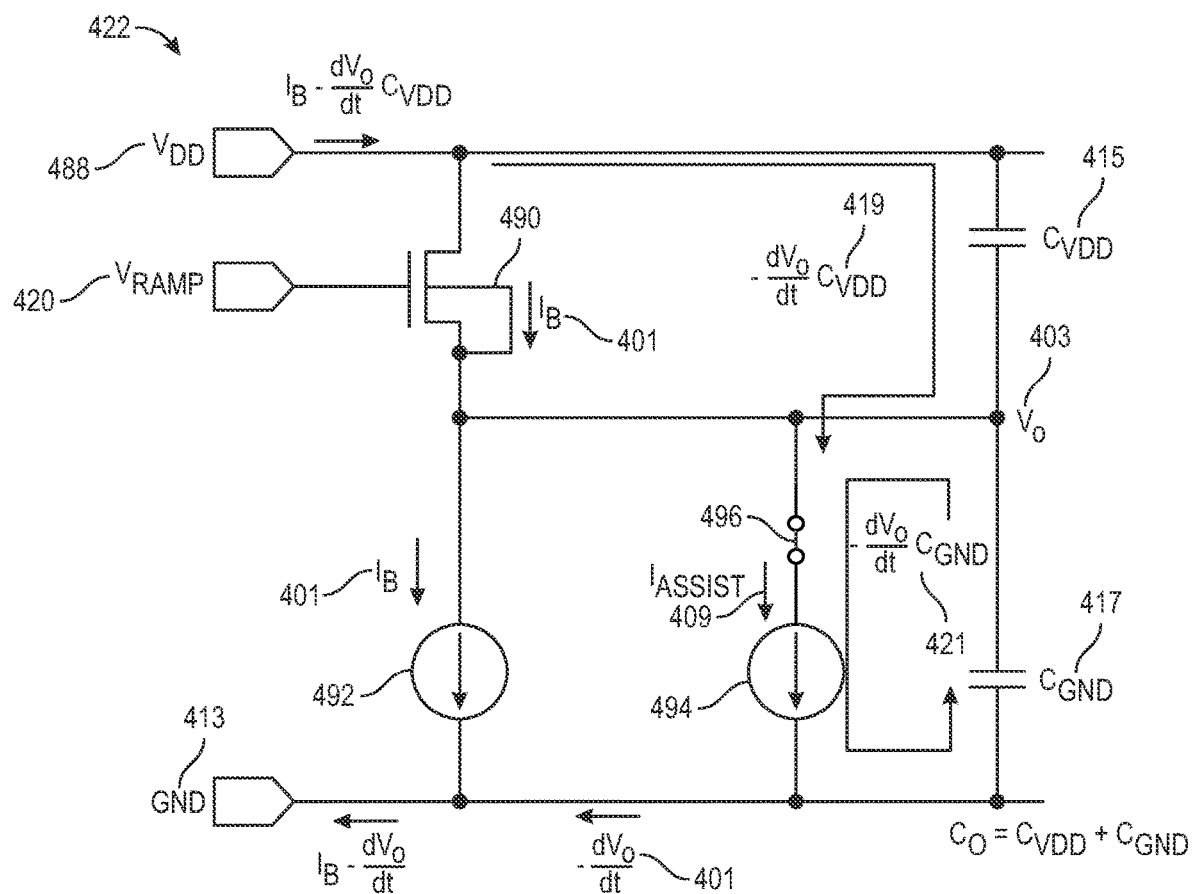
FIG. 4B shows one example of a schematic of a local ramp buffer circuit including a ramp settling assist circuit illustrating power consumption from a power line during a ramp event in accordance with the teachings of the present invention.

FIG. 4B shows one example of a schematic of a local ramp buffer circuit including a ramp settling assist circuit illustrating power consumption from a power line during a ramp event in accordance with the teachings of the present invention. It is appreciated that the local ramp buffer circuit illustrated in FIG. 4B may be an example local ramp buffer circuit illustrated in FIG. 2, and that similarly named and numbered elements described above are coupled and function similarly below. It is further appreciated that the local ramp buffer circuit illustrated in FIG. 4B is the same as the local ramp buffer circuit illustrated in FIG. 4A with the exception that the assist current switch 496 is turned on in FIG. 4B because a ramp event is occurring in the ramp signal $V_{RAMP}$ 420 at this time. As such, the assist current source 494 is activated and the assist current $I_{ASSIST}$ 409 is conducted from the output of the input device 490 to ground through the assist current source 494. As mentioned, the assist current $I_{ASSIST}$ 409 is only drawn from the output of the input device 490 to ground during a ramp event in the ramp signal $V_{RAMP}$ 420.

In the depicted example, during a ramp event in the ramp signal $V_{RAMP}$ 420, the output voltage $V_O$ 403 at the output of the input device 490 and across the ground capacitor $C_{GND}$ 417 follows the ramp signal $V_{RAMP}$ 420 and therefore decreases continuously with respect to time. As such, the ground capacitor $C_{GND}$ 417 is charged with a charging current 421 according to the following equation:

$$C_{GND} \text{ charging current} = -\frac{dV_O}{dt} C_{GND} \qquad (3)$$

In the various examples, the assist current $I_{ASSIST}$ 409 provided by the assist current source 494 is substantially equal in magnitude to the charging current 421 of output capacitance $C_O$ which is sum of the ground capacitor $C_{GND}$ 417 and the power line capacitor $C_{VDD}$ during the ramp event. Thus, the assist current $I_{ASSIST}$ 409 can also be determined according to the following equation:

$$I_{ASSIST} = -\frac{dV_O}{dt} C_O \qquad (4)$$

As further shown in the depicted example, during the ramp event in the ramp signal $V_{RAMP}$ 420, the power line capacitor $C_{VDD}$ 415 is also charged during the ramp event in the ramp signal $V_{RAMP}$ 420 with a charging current according to the following equation:

$$C_{VDD} \text{ charging current} = -\frac{dV_O}{dt} C_{VDD} \qquad (5)$$

It is appreciated that the $C_{VDD}$ charging current through power line capacitor $C_{VDD}$ 415 is drawn from the power line 488 during the ramp event in the ramp signal $V_{RAMP}$ 420 and that this $C_{VDD}$ charging current through power line capacitor $C_{VDD}$ 415 is absorbed by ground. As such, the total current provided by the power line 488 and that the total current absorbed by ground during the ramp event in the ramp signal $V_{RAMP}$ 420 is equal to:

$$I_B - \frac{dV_O}{dt} C_{VDD}. \qquad (6)$$

Accordingly, it is further appreciated that with the assist current source 494 providing the charging current $-(dV_O/dt)^*C_O$, the current in the power line 488 is therefore substantially unaffected by the charging current of the ground capacitor $C_{GND}$ during the ramp event generated in the ramp signal 420 in accordance with the teachings of the present invention.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A ramp buffer circuit, comprising:
    an input device having an input coupled to receive a ramp signal;
    a bias current source coupled to an output of the input device, wherein the input device and the bias current source are coupled between a power line and ground; and
    an assist current source coupled between the output of the input device and ground, wherein the assist current source is configured to conduct an assist current from the output of the input device to ground only during a ramp event generated in the ramp signal.

2. The ramp buffer circuit of claim 1, wherein the assist current conducted by the assist current source during the ramp event generated in the ramp signal is substantially equal to a charging current of an output capacitor coupled to the output of the input device during the ramp event generated in the ramp signal.

3. The ramp buffer circuit of claim 2, wherein a current in the power line is substantially unaffected by the charging current of the output capacitor coupled to the output of the input device during the ramp event generated in the ramp signal.

4. The ramp buffer circuit of claim 1, further comprising an assist current switch coupled to the assist current source, wherein the assist current switch is configured to be turned on only during the ramp event generated in the ramp signal such that the assist current source is configured to conduct the assist current from the output of the input device to ground only during the ramp event generated in the ramp signal.

5. The ramp buffer circuit of claim 1, wherein a current through the input device is substantially equal to a bias current conducted by the bias current source during the ramp event generated in the ramp signal, wherein the current through the input device is substantially equal to the bias current conducted by the bias current source during a non-ramp event generated in the ramp signal.

6. The ramp buffer circuit of claim 1, wherein the input device comprises an input transistor having a gate coupled to receive the ramp signal, wherein a drain of the input transistor is coupled to the power line, wherein a source of the input transistor is coupled to the bias current source and the assist current source.

7. The ramp buffer circuit of claim 6, wherein a drain-source current through the input transistor is substantially equal to a bias current conducted by the bias current source during the ramp event generated in the ramp signal, wherein the drain-source current through the input transistor is substantially equal to the bias current conducted by the bias current source during a non-ramp event generated in the ramp signal.

8. An imaging system, comprising:
an array of pixels to receive image light and generate an image charge voltage signal in response; and
readout circuitry coupled to receive the image charge voltage signal from the array of pixels and provide a digital representation of the image charge voltage signal in response, the readout circuitry including a comparator to receive the image charge voltage signal, compare the image charge voltage signals to a ramp signal from a ramp generator, and provide the digital representation of the image charge voltage signal in response, wherein the comparator is coupled to receive the ramp signal through a ramp buffer circuit, wherein the ramp buffer circuit comprises:
an input device having an input coupled to receive the ramp signal;
a bias current source coupled to an output of the input device, wherein the input device and the bias current source are coupled between a power line and ground; and
an assist current source coupled between the output of the input device and ground, wherein the assist current source is configured to conduct an assist current from the output of the input device to ground only during a ramp event generated in the ramp signal.

9. The imaging system of claim 8, wherein the assist current conducted by the assist current source during the ramp event generated in the ramp signal is substantially equal to a charging current of an output capacitor coupled to the output of the input device during the ramp event generated in the ramp signal.

10. The imaging system of claim 9, wherein a current in the power line is substantially unaffected by the charging current of the output capacitor coupled to the output of the input device during the ramp event generated in the ramp signal.

11. The imaging system of claim 8, wherein the ramp buffer circuit further comprises an assist current switch coupled to the assist current source, wherein the assist current switch is configured to be turned on only during the ramp event generated in the ramp signal such that the assist current source is configured to conduct the assist current from the output of the input device to ground only during the ramp event generated in the ramp signal.

12. The imaging system of claim 8, wherein a current through the input device is substantially equal to a bias current conducted by the bias current source during the ramp event generated in the ramp signal, wherein the current through the input device is substantially equal to the bias current conducted by the bias current source during a non-ramp event generated in the ramp signal.

13. The imaging system of claim 8, wherein the input device comprises an input transistor having a gate coupled to receive the ramp signal, wherein a drain of the input transistor is coupled to the power line, wherein a source of the input transistor is coupled to the bias current source and the assist current source.

14. The imaging system of claim 13, wherein a drain-source current through the input transistor is substantially equal to a bias current conducted by the bias current source during the ramp event generated in the ramp signal, wherein the drain-source current through the input transistor is substantially equal to the bias current conducted by the bias current source during a non-ramp event generated in the ramp signal.

* * * * *